(12) United States Patent
Henness

(10) Patent No.: US 8,653,678 B2
(45) Date of Patent: Feb. 18, 2014

(54) METHOD AND APPARATUS FOR A THERMO-ELECTRIC ENGINE

(76) Inventor: Marc Henness, Kissimmee, FL (US)

( * ) Notice: Subject to any disclaimer, the term of this patent is extended or adjusted under 35 U.S.C. 154(b) by 183 days.

(21) Appl. No.: 13/158,599

(22) Filed: Jun. 13, 2011

(65) Prior Publication Data

US 2011/0315183 A1 Dec. 29, 2011

Related U.S. Application Data

(60) Provisional application No. 61/398,617, filed on Jun. 29, 2010.

(51) Int. Cl.
*F02B 63/04* (2006.01)
*F03G 7/08* (2006.01)

(52) U.S. Cl.
USPC .............................. 290/1 R; 290/42; 290/53

(58) Field of Classification Search
USPC ........ 60/508, 512, 515, 516, 530; 290/1 R, 2, 290/42, 53; 310/12, 13, 15, 16, 27, 14, 35; 123/46 E, 46 R, 45 R, 65 B
See application file for complete search history.

(56) References Cited

U.S. PATENT DOCUMENTS

| | | | | |
|---|---|---|---|---|
| 16,781 A | * | 3/1857 | Allen | 91/254 |
| 5,329,768 A | * | 7/1994 | Moscrip | 60/518 |
| 6,594,997 B2 | * | 7/2003 | Romanelli | 60/651 |
| 2003/0192582 A1 | * | 10/2003 | Guevara | 136/205 |
| 2007/0169476 A1 | * | 7/2007 | Wood | 60/518 |
| 2010/0139262 A1 | * | 6/2010 | Gimsa | 60/525 |

* cited by examiner

*Primary Examiner* — Tulsidas C Patel
*Assistant Examiner* — Thomas Quigley
(74) *Attorney, Agent, or Firm* — Daniel Law Offices, PA; Jason T. Daniel, Esq

(57) ABSTRACT

An engine apparatus and method for operating same is disclosed. The engine generates electrical energy from phase changes of two different mixtures within chambers of the engine. Thermoelectric generators are preferably utilized to generate electrical energy from thermo differentials within the engine created by phase changes during engine operation. The engine may additionally be operated to perform mechanical based work.

13 Claims, 4 Drawing Sheets

METHOD AND APPARATUS FOR A THERMO-ELECTRIC ENGINE

CROSS REFERENCE TO RELATED APPLICATIONS

This application claims the benefit of U.S. Provisional Application No. 61/398,617 filed on 29 Jun. 2010, the contents of which are hereby incorporated by reference.

TECHNICAL FIELD

This disclosure is related to thermo-electric engines. More particularly, the disclosure relates to an engine configured to create a thermal gradient from state of matter changes and to generate electrical or mechanical energy from the thermal gradient.

BACKGROUND

The statements in this section merely provide background information related to the present disclosure and may not constitute prior art.

Modern societies are critically dependent on energy. All aspects of modern life, ranging from consumer and business devices to the powering of mechanical tools, require the consumption of energy. As traditional energy sources are depleted or become less accessible through regulations, energy costs increase, providing incentives for increasing energy production efficiencies and lowering energy costs. For example, costs associated with hydrocarbon-based energy production have increased significantly over the past decade. Therefore, it would be advantageous to generate energy utilizing alternative means of energy production.

Energy generated utilizing phase transitions of matter is one means of generating electric or mechanical-based energy without using hydrocarbons. A phase transition is the transformation of mass in a thermodynamic system from one state of matter to another. During a phase transition of a given substance, certain properties of the substance change as a result of some external condition, such as temperature and pressure. For example, a liquid may become gas as pressure decreases or a gas may become a liquid as pressure increases in a thermodynamic system. Changes in conditions of a gas are generally described by the Ideal Gas Law: $PV=nRT$ Where P is the absolute pressure of the gas; V is the volume; n is the number of particles in the gas; R is the gas constant; and T is the absolute temperature. The work created, and therefore the maximum potential energy which can be collected from an ideal gas expansion, assuming that the pressure remains constant, is $nRT*\ln(Vmax/V0)$ where Vmax is the maximum volume when expanded, and V0 is the initial volume before expansion. For simplicity of the equation, it is assuming that the gas is prevented from expanding while the gas is heated, then allowed expand once it has reached full temperature. This is described by the integral of pressure multiplied by a change in volume for the volume change over V0 to Vmax. Note, that the expansion of the gas does not cause a significant change in temperature, therefore a temperature gradient would remain.

The efficiency of the energy that can be collected by gas expansion, and compression between the two chambers would be limited to the Carnot Efficiency, i.e., $(Th-Tc)/Th$, however efficiency is based exclusively on the work created by ideal gas expansion, and does not consider the possibility of collecting potential energy by other means as it transfers across the gradient. Therefore, it would be advantageous to for an engine to generate energy using phase transitions and thermoelectric generators.

SUMMARY

An engine apparatus and method for operating same is disclosed. The engine generates electrical energy from phase changes of two different mixtures within chambers of the engine. Thermoelectric generators are preferably utilized to generate electrical energy from thermo differentials within the engine created by phase changes during engine operation. The engine may additionally be operated to perform mechanical based work.

Certain embodiments of the invention include a feature of generating electrical energy utilizing an electrical generator. Linear motion within the engine is translated to rotational based motion utilized by the electrical generator. In one embodiment, the electrical generator may additionally be utilized as an electrical motor to move components of the engine during energy generation cycles.

This summary is provided merely to introduce certain concepts and not to identify key or essential features of the claimed subject matter.

BRIEF DESCRIPTION OF THE DRAWINGS

One or more embodiments will now be described, by way of example, with reference to the accompanying drawings, in which.

DETAILED DESCRIPTION

Figure 1:
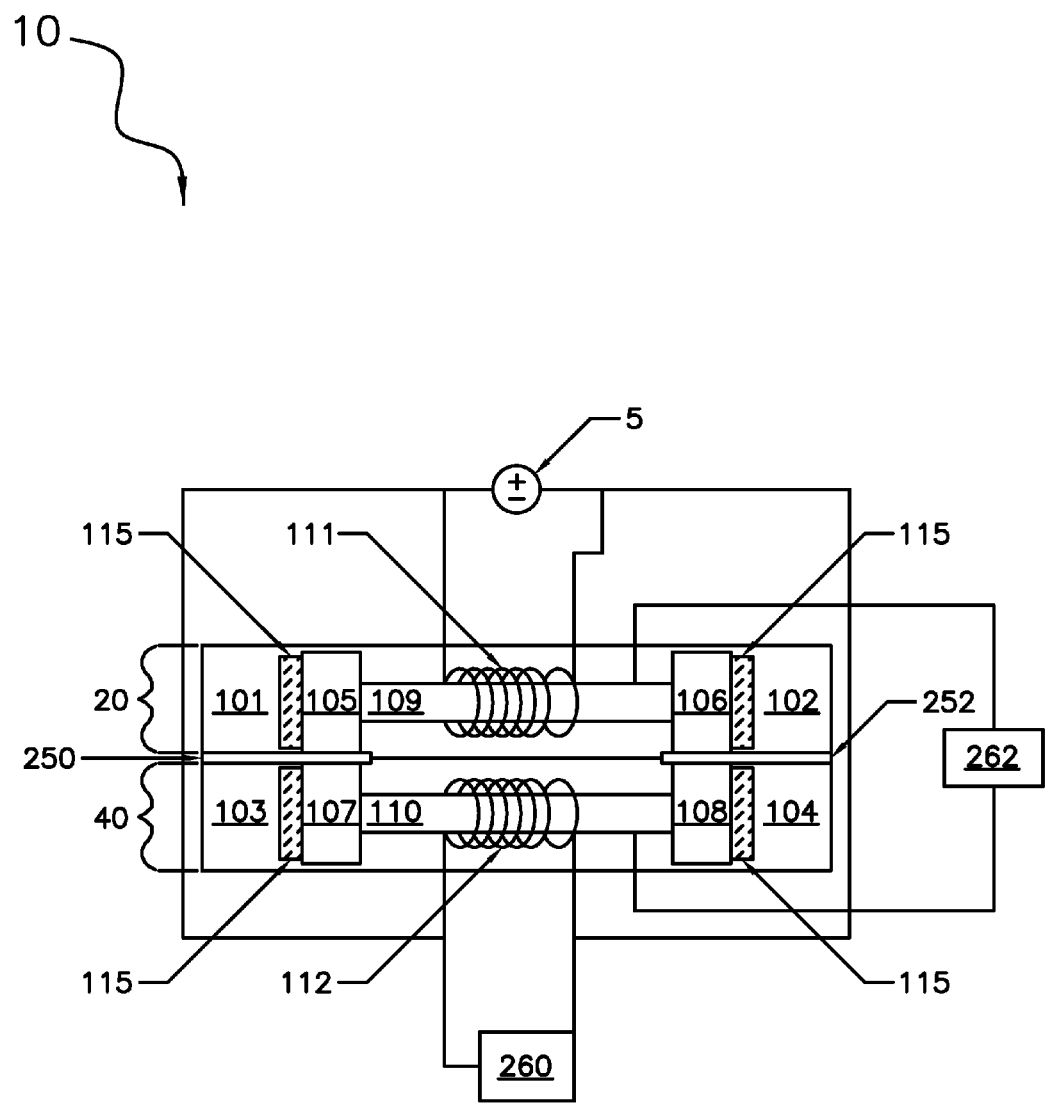
FIG. 1 is a sectional view of an engine apparatus in a neutral state, in accordance with the present disclosure.
Figure 2:
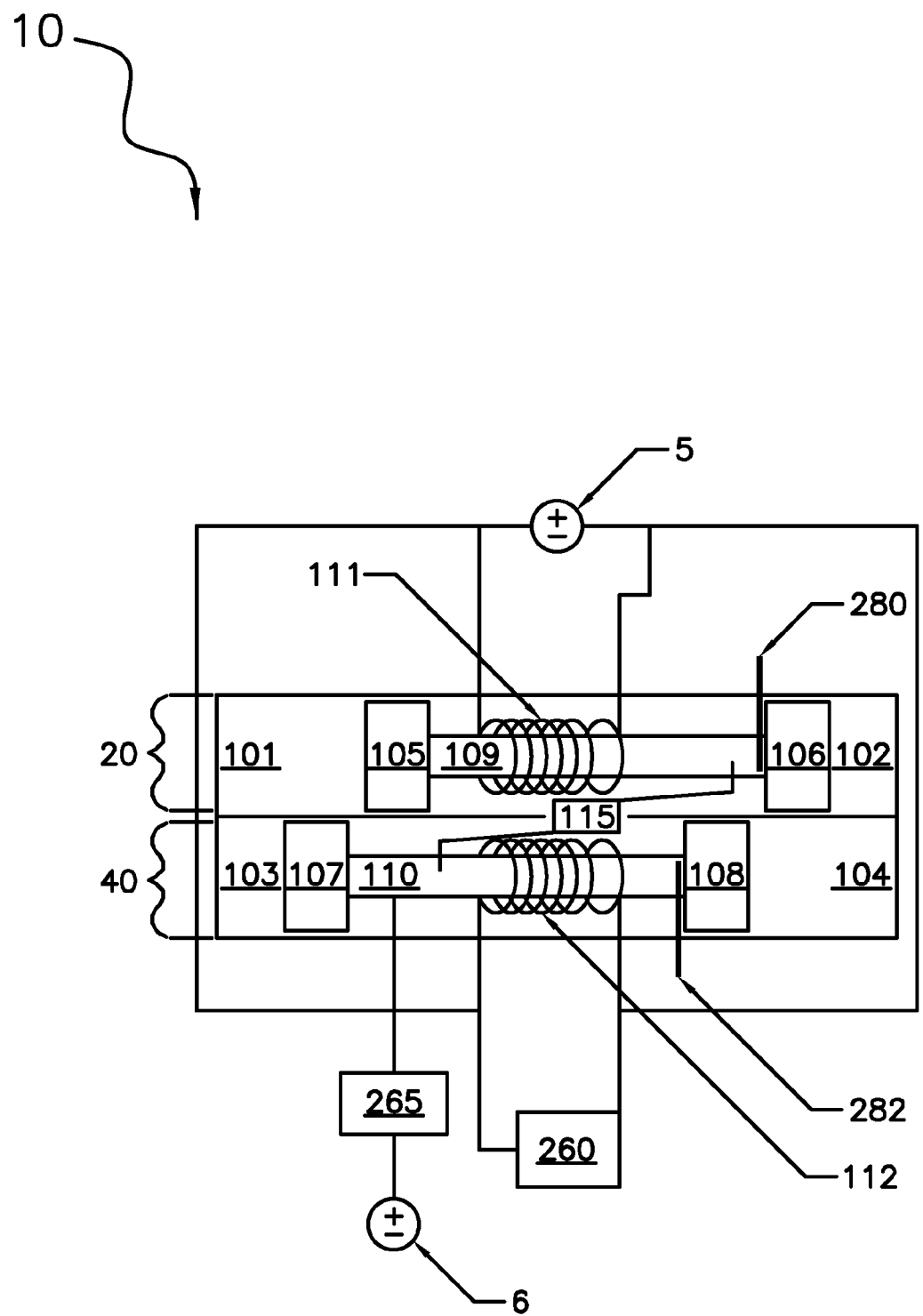
FIG. 2 is a sectional view of the engine apparatus while in a top position during an energy generation cycle, in accordance with the present disclosure.
Figure 3:
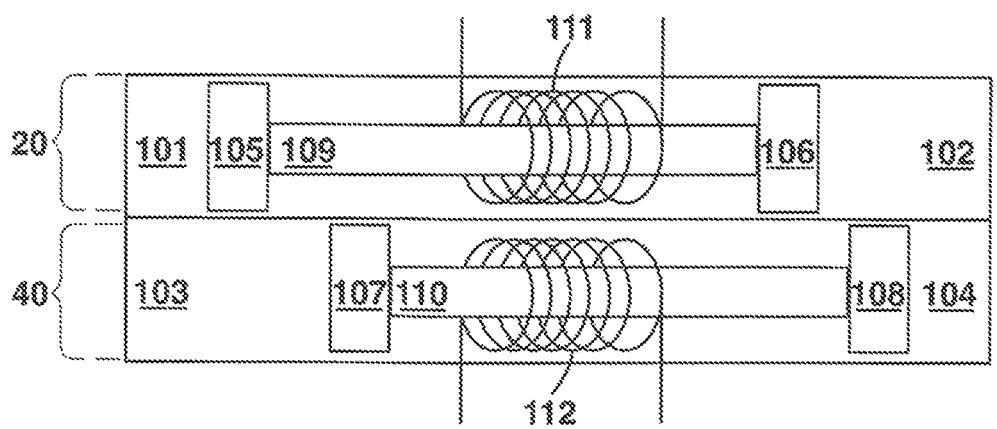
FIG. 3 is a sectional view of the engine apparatus while in a bottom position during an energy generation cycle, in accordance with the present disclosure.

Referring now to the drawings, wherein the showings are for the purpose of illustrating certain exemplary embodiments only and not for the purpose of limiting the same, FIGS. 1-3 show sectional views of an engine apparatus 10 in different operational states of an energy generation cycle. For ease of illustration, and not to limited the present disclosure, FIGS. 1-3 each show different embodiments of the engine apparatus 10 whereby certain elements are shown in certain figures and not shown in others. FIG. 1 shows the engine 10 in a neutral state. FIG. 2 shows the engine 10 in a first energy generating state. FIG. 3 shows the engine 10 in a second energy generating state.

The engine 10 includes a first housing structure 20 configured to contain a first rod-plunger assembly and a second housing structure 40 configured to contain a second rod-plunger assembly. The first rod-plunger assembly includes a rod 109 and a first and second plunger 105 and 106. The second rod-plunger assembly includes a second rod 110 and a third and fourth plunger 107 and 108. The first and second housing structures 20 and 40 are configured to permit lateral movement of the first and second rod-plunger assembly within the first and second housing structures 20 and 40, respectively. In one embodiment, the first and second housing structures 20 and 40 are cylindrically shaped. The battery 260 is preferably attached to first and second coils 111 and 112. In one embodiment, an electric motor 262 is attached to the second rod-plunger assembly, preferably through a gearbox configured to convert rotational motion of the electric motor to linear motion.

The first housing structure 20 and the first rod-plunger assembly are configured to form a first and second gas chamber 101 and 102 within the first housing structure 20. The first and second gas chambers 101 and 102 are configured to contain a gaseous mixture. The second housing structure 40 and the second rod-plunger assembly are configured to form a first and second refrigerant chamber 103 and 104. The first and second refrigerant chambers 103 and 104 are configured to contain a refrigerant. The refrigerant is preferably a Type 1 Refrigerant such as $CO_2$, Ammonia, or Fluorocarbons. In one embodiment, the refrigerant is a mixture of more than one Type 1 refrigerant. During engine operation, the refrigerant transitions between gaseous state and a liquid state. The refrigerant is preferably selected for preferential phase transition properties enabling desirable transitions between a gaseous state and a liquid state during energy generation cycles.

The first and second housing structures 20 and 40 are thermally coupled between the first gas chamber 101 and the first refrigerant chamber 103, and thermally coupled between the gaseous chamber 102 and the second refrigerant chamber 104 by a heat conducting material 250 and 252 such as copper to perpetuate thermal energy transfer between the first gas chamber 101 and the first refrigerant chamber 103. All other interior walls of the first and second housing structures 20 and 40 are preferably constructed with heat resistive material such as PVC. Exterior walls may be insulated with another insulating material such as aluminum. In one embodiment, aluminum is used for the exterior walls to increase housing structure integrity and provide additional insulation.

The plungers 105, 106, 107, and 108 may be continuously connected to an associated rod such as by forging or casting. In one embodiment, the plungers 105, 106, 107, and 108 are mechanically connected to an associated rod using any known secure mechanical means such as a fastener, a nut and bolt assembly, tapered screws, and/or weld. Those of ordinary skill in the relevant arts will understand and appreciate that multiple attachment means and fabrication methods may be used to assemble the engine 10 and the rod-plunger assemblies without departing from the present disclosure and is therefore not intended to be limited thereby. The plungers 105, 106, 107, and 108 are abutted with side walls within the first and second housing structures 20 and 40 in such a manner to substantially prohibit matter from exiting the first and second gas chambers 101 and 102 and the first and second refrigerant chambers 103 and 104, and permit lateral movement up the side walls.

In one embodiment, the plungers 105, 106, 107, and 108 include solid state thermoelectric generators 115 ("TEGs") to convert thermal energy within the chambers 101, 102, 103, and 104 to electrical energy. Thermal energy is generated in the chambers 101, 102, 103, and 104 during engine operation as described herein below. The TEGs 115 convert thermal energy across a temperature gradient around one of the chambers 101, 102, 103, and 104.

The first and second rods 109 and 110 are configured to secure the plungers 105, 106, 107, and 108 within the first and second housing structures 20 and 40. The first and second rods 109 and 110 are constructed of magnetized material configured to induce an electrical current in an associated coil when moved within the associated coil. The first and second rods 109 and 110 are additionally configured to move laterally within the first and second housing structures 20 and 40 at selected times during engine operation. As shown in FIG. 2, a first blocking member 280 is included with the first housing structure 20 and a second blocking member 282 is included with the second housing structure 40 in one embodiment. The first and second blocking members 280 and 282 are configured to selectively actuate into the first and second rods 109 and 110 holding the rod in position, such as in an energy collecting position as described herein below. In one embodiment, the blocking members 280 and 282 are configured for actuation into a recess of the rods 109 and 110.

A first coil 111 is a conducting wire wrapped around the first rod 109 to form a solenoid. A second coil 112 is a conducting wire wrapped around the second rod 110 to form a solenoid. The first and second coils 111 and 112 are preferably tightly wound in a helix and insulated. The coils 111 and 112 are stationary within the housing structures 20 and 40 and, preferably, not in physical contact with the rods 109 and 110 to minimize frictional forces against the rods from moving within the housing structures 20 and 40 during engine operation. The coils 111 and 112 are configured to carry electrical current around the rods 109 and 110. Electrical current may selectively flow from a first end of a coil to a second end of a coil or, in one embodiment, reversed to flow from the second end to the first end of the coil. Electrical current may be supplied to the first and second coils 111 and 112 from any known electrical power source 5 such as a battery.

Lateral movement of the rods 109 and 110 within the housing structures 20 and 40 may be powered by supplying an electrical current through an attached coil. Electrical current movement through a coil creates a magnetic field around the coil and a magnetic force parallel to an associated rod. The magnitude of the magnetic field produced by the electrical current is directly proportional to the current passing through the coil and inversely proportional to the radius of the circular coil. The strength of the magnetic field produced by the electrical current through the coil can be increased by increasing the number of turns around the rod by the coil, increasing electrical current through the coil, and/or decreasing a radius of the coil. Reversing direction of electrical current flow through the coil reverse direction of the magnetic force acting upon the rod.

Lateral movement of the rods 109 and 110 may additionally be powered by thermodynamic events within the chambers 101, 102, 103, and 104. Thermodynamic events within the chambers 101, 102, 103, and 104 may create a force against an adjacent plunger causing a force to be applied to a connected rod. When the force is above a threshold, sufficient to overcome inherent frictional and inertial forces, the connected rod will move laterally within the housing structure through the coil. For example, a thermodynamic event in the first gas chamber 101 creates a force against the plunger 105, moving the first rod 109 through the first coil 111. Movement of a rod through a coil produces an electrical current within the coil that may be used or stored in a electrical energy storage device, such as a battery. For example, movement of the first rod 109 through the first coil 111 produces an electrical current. While generated linear motion of the rods 109 and 110 may be captured by electrical means such as via the coils 111 and 112 as described herein above, in one embodiment, mechanical means may be used to capture the generated energy via an electric generator by translating the linear motion of the rods 109 and 110 into rotational motion used by the electric generator to generate electrical energy.

In one embodiment, the electric motor 262 is configured to operate as an electrical power generator and is mechanically connected to the rods 109 and 110. The generator preferably includes stator(s), rotor(s), and/or additional components configured to selectively operate as a motor, i.e., convert electrical power to mechanical power, and as a generator, i.e., convert mechanical power to electrical power. The generator preferably is configured to operate in a first, driving mode configured to deliver mechanical power to the rods 109 and 110 and a second, driven mode configured to receive mechanical power from the rods 109 and 110 for subsequent conversion to electrical power. Additionally, the generator may be configured to selectively operate in forward and reverse directions when operating as either a motor or a generator. Thus, the generator may be any type of device that is either 1) configured to operate as a motor using electricity or some other source of energy, 2) configured to receive mechanical power and produce electrical power, or 3) configured such that it can selectively operate as a motor or as a generator.

The first rod 109 could alternatively be linked to a gearing mechanism to a drive system used for mechanical work rather than to an electric generator. As shown in FIG. 2, this could include a mechanical linkage 115 back to the second rod 110 for driving the phase transition process. The second rod 110 can alternatively be driven by mechanical means such as an engine rather than an electric motor as described herein above. In one embodiment, the mechanical means is provided by a linear actuator 265 powered by a three phase DC power source 6, although alternate power sources may be used in alternate embodiments. The second rod 110 also can be mechanically linked to Rod 109 as a drive mechanism for all phases of the electrical generation cycle after the first energy generation phase of the first cycle.

In one embodiment, energy generated by the engine 10 be translated back to the rods 109 and 110 electrically, mechanically, or a combination of both. As one skilled in the art will recognize, mechanical translation has efficiency advantages, however mechanical translation disadvantageously includes longer delays deriving from movements of rods 109, and 110.

FIG. 1 shows the engine 10 in a neutral or OFF operating state. As FIG. 1 shows, the first and second gaseous chambers 101 and 102 and the first and second refrigerant chambers 103 and 104 have an equal volume. Equal volume indicates equal thermal conditions within the chambers including temperature and pressure. The neutral operating state can represent a theoretical operating state for modeling purposes.

In operation, the engine 10 generates electrical energy during two phases of an energy generation cycle. The engine 10 is controlled from a first energy generation state to the second energy generation state, and from the second energy generation state to the first energy generation state throughout engine operation. Electrical energy is generated by TEGs within each of the plungers at varying time of the energy generation cycle and by movement of the rods 109 and 110 through the coils 111 and 112 as described herein below.

When starting the engine 10 from a state of equilibrium or a neutral operating state, the second rod 110 is moved to a first energy generation state as shown in FIG. 2. The rod 110 may be moved as described herein above by mechanical means through use of the electrical power generator 262 or by electrical means by supplying electrical energy through the coil 112, thereby inducing a magnetic field and creating a magnetic force that moves the rod 110 into position. After positioning the engine 10 in the first energy generation state, a blocking member 282 may be utilized to hold the rod 110 into position. In one embodiment, if the rod 110 is mechanically connected to the electrical power generator 262, then gears or mechanical connectors between the generator 262 and the rod 110 may be locked. Alternatively or additionally, electrical energy may be supplied continually through the coil 112 to position the rod 110. As one skilled in the art will readily recognize, mechanical means to temporary lock the rod 110 into the first energy generation state are preferably as less energy is consumed than through electrical means via the coil 112. The first rod 109 is similarly locked into position using one of the above mentioned locking approaches before initiating the first energy generation phase.

Subsequent to moving the rod 110 into the first energy generation state, refrigerant in the first refrigerant chamber 103 is compressed from a gaseous state to a liquid state generating thermal energy. Increased thermal energy in the refrigerant chamber is used by TEGs in the plunger 107 to generate electrical energy. Concurrently, a thermal energy difference between the first gaseous chamber 101 and the first refrigerant chamber 103 causes a thermal energy transfer from the first refrigerant chamber 103 to the first gaseous chamber 101. Thermal energy within the first gaseous chamber 101 is then converted to electrical energy by TEGs in the plunger 105. As thermal energy increases within the first gaseous chamber 101, pressure increases creating a force against the plunger 105.

Concurrently, volume expansion and pressure decreases in the second refrigerant chamber 104 caused by movement of the second rod 110 cause a temperature decrease in the chamber 104. Thermal differences between the second gaseous chamber 102 and the second refrigerant chamber 104 cause a thermal energy transfer from the second gaseous chamber 102 to the second refrigerant chamber 104 creating a temperature increase in the second refrigerant chamber 104 and a temperature decrease in the second gaseous chamber 102. TEGs in the plungers 106 and 108 use the newly created temperature differentials to generate electrical energy.

The first rod is unlocked i.e., permitted to move freely within the first housing structure 20, after achieving a maximum thermal difference between the first gaseous chamber 101 and the first refrigerant chamber 103 or, alternatively or additionally, the second gaseous chamber 102 and the second refrigerant chamber 104. In one embodiment, the rod 109 may be unlocked after a predetermined elapsed time interval is achieved after initiating the first phase of the energy generation cycle. The predetermined elapsed time interval may be based upon known thermodynamic energy transfer rates for a particular hardware configuration among the chambers 101, 102, 103, and 104. The predetermined elapsed time interval represents an estimate when the maximum thermal difference between either the first gaseous chamber 101 and the first refrigerant chamber 103 or the second gaseous chamber 102 and the second refrigerant chamber 104 is achieved.

Release of the first rod 109 from a locked state permits pressure in the gaseous chamber 101 to laterally move the plunger 105 and rod 109, increasing volume in the first gaseous chamber 101. The lateral movement by the rod 109 changes the magnetic flux through the coil 111, generating electrical current within the coil 111. Release of the rod 109 will cause lateral oscillation of the rod 109 with respect to the coil 111 changing the magnetic flux and generating electrical current. The rod 109 will oscillate until a pressure differential between the first and second gaseous chambers 101 and 102 is less than a threshold magnitude sufficient to move the rod 109. Upon substantially reaching a pressure equilibrium between the first and second gaseous chambers 101 and 102, the rod 109 is preferably locked, preventing lateral movement. Additional potential energy may be collected by TEGs based upon temperature differences between the first and second gaseous chambers 101 and 102.

After energy production reaches a predetermined threshold, the engine 10 may be controlled to a second energy generation state as shown in FIG. 3. A second phase of the energy generation cycle includes controlling the engine 10 to the second energy generation state by moving the rod 110 from the position shown in FIG. 2 to the position as shown in FIG. 3 and locking the rod 110 into position until the second phase is completed. The first rod 109 is locked at a position as substantially shown in FIG. 3 to start the second phase of the energy generation cycle. An amount of work required M to move the rod 110 from the position shown in FIG. 2 to the position shown in FIG. 3 accounts for a liquefaction phase transition within the first refrigerant chamber 103 and an evaporation phase transition within the second refrigerant chamber 104. The amount of required $W_r$ to move the rod 110 from the first energy generation state to the second energy generation state is as follows:

$$W_r = \frac{\Delta P_{rR}}{\Delta V_{rR}} \times \left(V_{rR_0} \times \Delta V_{rR} - \frac{\Delta V_{rR}^{sq}}{2}\right) + \quad [1]$$
$$P_{re} \times \Delta V_{rR} - \frac{\Delta P_{rL}}{\Delta V_{rL}} \times \left(V_{rL_0} \times \Delta V_{rL} - \frac{\Delta V_{rL}^{sq}}{2}\right) - P_{re} \times \Delta L$$

where
$V_{rRo}$ is an initial volume of the second refrigerant chamber 104 before initiating the second phase of the energy generation cycle,
$V_{rLo}$ is an initial volume of the first refrigerant chamber 103 before initiating the second phase of the energy generation cycle, $$\Delta V_{rR} = (V_{re} - V_{rR_1}) \quad [2]$$
$$\text{where } V_{re} = \frac{(V_{rR_1} + V_{rR_0})}{2}$$

where $V_{rR1}$ is a final volume of the second refrigerant chamber 104 calculated by:

$$V_{rR_1} = \frac{n_r}{D_{rlR_1}} \quad [3]$$

where $D_{rlR1}$ is a final liquid density of refrigerant in the second refrigerant chamber 104, and $n_r$ is the number of moles of refrigerant in each refrigerant chamber, assuming that the system will be setup such that the pressure temperature at $V_{rLo}$ will be above a saturation point, and the refrigerant will initially be nearly 100% vapor in the first refrigerant chamber 103 before the transition from the first energy collection state FIG. 2 to the second energy collection stat FIG. 3.

$$\Delta P_{rR} = (P_{rR_1} - P_{re}) \quad [4]$$

where
$P_{rR1}$ is a final pressure in the second refrigerant chamber 104, and where $P_{re}$ is:

$$P_{re} = \frac{(P_{rR_1} + P_{rR_0})}{2} \quad [5]$$

where
$P_{rR1}$ is a final pressure in the second refrigerant chamber 104 after the rod 110 is positioned as shown in FIG. 3, and
$P_{rRo}$ is an initial pressure in the second refrigerant chamber 104 after initiating the second phase of the energy generation cycle $$\Delta V_{rR}^{sq} = (V_{re}^2 - V_{rR1}^2) \quad [6]$$

where
$V_{rR}^{sq}$, for convenience by reducing the complexity of a work computation, represents the volume of each refrigerant chamber 103 and 104 at the neutral state squared minus a volume of the second refrigerant chamber 104 in a fully compressed state squared,
$V_{re}^2$ is the square of the volume of each refrigerant chamber 103, and 104 at the neutral state, and
$V_{rR1}^2$ is the square of the volume of the second refrigerant chamber 104 in a fully compresses state.

$$\Delta V_{rL} = (V_{re} - V_{rL1}) \quad [7]$$

where
$V_{rL1}$ is a final volume of the first refrigerant chamber 103, and $$V_{re} = \frac{(V_{rL_1} + V_{rL_0})}{2},$$

a volume of the refrigerant chambers 103 and 104 at the neutral state.

$$\Delta P_{rL} = (P_{rL1} - P_{re}) \quad [8]$$

where
$P_{rL1}$ is a final pressure in the second refrigerant chamber 104

$$\Delta V_{rL}^{sq} = (V_{re}^2 - V_{rL2}^2) \quad [9]$$

where
$V_{re}^2$ is a square of the volume of the refrigerant chambers 103 and 104 at the neutral state, and
$V_{rL1}^2$ is a square of the volume of the first refrigerant chamber 103 in a fully expanded state.

Heat generated by movement of the rod 110 from the first phase of the energy generation cycle to the second phase of the energy generation cycle is calculated as follows:

$$Q_R = \frac{n_r \times (LH_{rR_0} + LH_{rR_1})}{2} \quad [10]$$

where
$Q_R$ is the heat generated, and $n_r = V_{rRo} \times D_{rRo}$, assuming that the system will be setup such that the pressure temperature at $V_{rRo}$ will be above a saturation point, and the refrigerant will be nearly 100% vapor, where:
$D_{rRo}$ is an initial vapor density in the second refrigerant chamber 104,
$LH_{rRo}$ is an initial latent heat in the second refrigerant chamber 104, and
$LH_{rR1}$ is a final latent heat in the second refrigerant chamber 104.

Subsequent to moving the rod 110 into the second energy generation state, refrigerant in the second refrigerant chamber 104 is compressed from a gaseous state to a liquid state generating thermal energy. Increased thermal energy in the refrigerant chamber is used by TEGs in the plunger 108 to generate electrical energy. Concurrently, a thermal energy difference between the second gaseous chamber 102 and the second refrigerant chamber 104 causes a thermal energy transfer from the second refrigerant chamber 104 to the second gaseous chamber 102. Thermal energy within the second gaseous chamber 102 is then converted to electrical energy by TEGs in the plunger 106. As thermal energy increases within the second gaseous chamber 102, pressure increases creating a force against the plunger 106.

Concurrent with thermal energy increases in the second gaseous chamber 102, volume expansion and pressure decreases in the first refrigerant chamber 103 caused by movement of the second rod 110 cause a temperature decrease in the chamber 103. Assuming a linear relationship between latent heat and temperature, which may be different for different refrigerant types, thermal energy absorbed by the refrigerant in the chamber 103 may be estimated using the following formula:

$$Q_L = \frac{n_r \times (LH_{rL_0} + LH_{rL_1})}{2} \qquad [11]$$

where
$LH_{rLo}$ is the initial latent heat in the first refrigerant chamber 103, and
$LH_{rL1}$ is the final latent heat in the first refrigerant chamber 103.

Thermal differences between the first gaseous chamber 101 and the first refrigerant chamber 103 cause a thermal energy transfer from the first gaseous chamber 101 to the first refrigerant chamber 103 creating a temperature increase in the first refrigerant chamber 103 and a temperature decrease in the first gaseous chamber 101. TEGs in the plungers 105 and 107 use the newly created temperature differentials to generate electrical energy.

The first rod is unlocked after achieving a maximum thermal difference between the first gaseous chamber 101 and the first refrigerant chamber 103 or, alternatively or additionally, the second gaseous chamber 102 and the second refrigerant chamber 104. In one embodiment, the rod 109 may be unlocked after a predetermined elapsed time interval is achieved. The predetermined elapsed time interval may be based upon known thermodynamic energy transfer rates for a particular hardware configuration among the chambers 101, 102, 103, and 104. The predetermined elapsed time interval represents an estimate when the maximum thermal difference between either the first gaseous chamber 101 and the first refrigerant chamber 103 or the second gaseous chamber 102 and the second refrigerant chamber 104 is achieved.

Release of the first rod 109 from a locked state permits pressure in the second gaseous chamber 102 to laterally move the plunger 106 and rod 109, increasing volume in the second gaseous chamber 102. The lateral movement by the rod 109 changes the magnetic flux through the coil 111, generating electrical current within the coil 111. Release of the rod 109 will cause lateral oscillation of the rod 109 with respect to the coil 111 changing the magnetic flux and generating electrical current. The rod 109 will oscillate until a pressure differential between the first and second gaseous chambers 101 and 102 is less than a threshold magnitude sufficient to move the rod 109. Upon substantially reaching a pressure equilibrium between the first and second gaseous chambers 101 and 102, the rod 109 is preferably locked, preventing lateral movement. Additional potential energy may be collected by TEGs based upon temperature differences between the first and second gaseous chambers 101 and 102.

The potential work accomplished by thermal energy changes in the first and second gaseous chamber during the second phase of the energy generation cycle may be calculated using the following equation:

$$W_g = n_g \times R \times \left( T_{R_1} \times \ln\frac{V_{gR_1}}{V_{gR_0}} - T_{R_1} \times \ln\frac{V_{gL_1}}{V_{gL_0}} \right) \qquad [12]$$

where
$W_g$ is the potential work,
$n_g$ is a number of moles of gas in each of the first and second gaseous chambers 101 and 102, and may be calculated using the following equation:

$$n_g = \frac{Q_L}{C_g \times (T_{R_1} - T_{L0})} - \frac{C_r \times n_r}{C_g} \qquad [13]$$

where
R is a constant of approximately 0.008314 kJ/mol*K,
$T_{R1}$ is a final Temperature in degrees K of the second gaseous chamber 102,
$T_{L1}$ is a final Temperature in degrees K of the first gaseous chamber 101,
$V_{gRo}$ is an initial volume of the second gaseous chamber 102,
$V_{gR1}$ is a final volume of the second gaseous chamber 102,
$V_{gLo}$ is an initial volume of the first gaseous chamber 101, and
$V_{gL1}$ is a final volume of the first gaseous chamber 101.

Temperature in the first gaseous chamber 101 may be calculated using the following formula:

$$T_{L_1} = T_{L_0} - \frac{Q_L}{C_g \times n_g + C_r \times n_r} \qquad [14]$$

where
$Q_L$ is the thermal energy absorbed by gas in the first gaseous chamber 101,
$T_{Lo}$ is an initial temperature in degrees K of the first gaseous chamber 101.
$T_{Lo}$ is an initial temperature in degrees K of the first gaseous chamber 101.
$C_g$ is a heat capacity at constant pressure for the gas in the first gaseous chamber 101, and
$C_r$ is a heat capacity at constant pressure for the gaseous matter.

Similarly, temperature in the second gaseous chamber 102 may be calculate using the following formula:

$$T_{R_1} = T_{R_0} + \frac{Q_R}{C_g \times n_g + C_r \times n_r} \qquad [15]$$

where
$Q_R$ is the thermal energy absorbed by gas in the chamber 102, and
$T_{Ro}$ is an initial temperature in degrees K of the second gaseous chamber 102.

As thermal conditions transition to thermal equilibrium among the chambers and energy production decreases, the engine 10 will achieve a predetermined threshold of energy production permitting the engine 10 to be controlled back to the first energy generation state to repeat the energy generation cycle.

Figure 4:
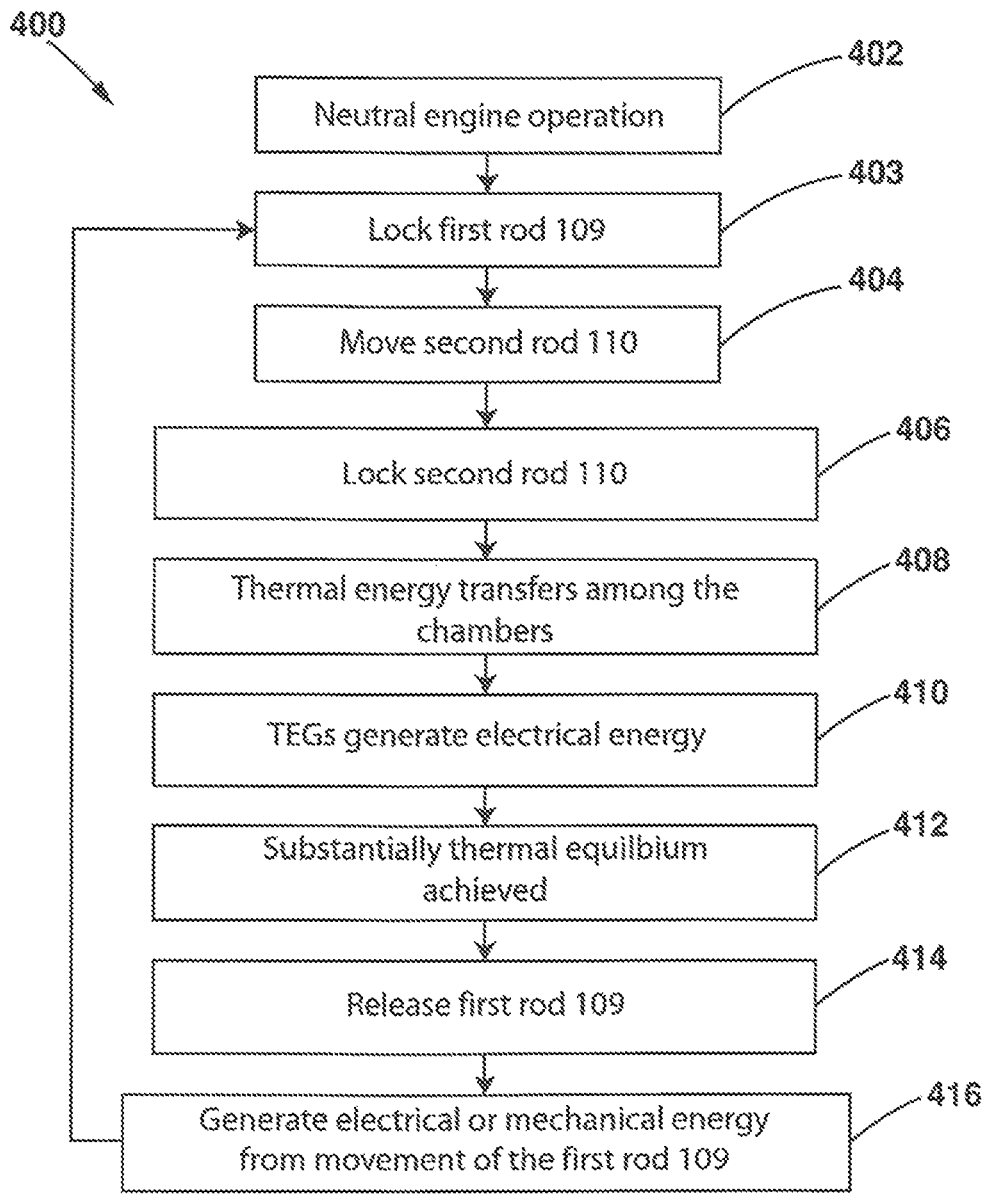
FIG. 4 is a flow chart illustrating an exemplary control method used to operate the engine apparatus during the energy generation cycle, in accordance with the present disclosure.

FIG. 4 shows a flow chart 400 illustrating engine control operations within an energy generation cycle. The engine begins operation in a neutral state 402. The first rod 109 is locked using one of the above mentioned locking approaches 403. Engine operation begins by moving the second rod 110 to a first position 404. In one exemplary operational method the second rod 110 is moved into position as shown in FIG. 2. The second rod and 110 is locked using one of the above mentioned locking approaches 406. Movement of the second rod 110 compresses refrigerant in one refrigerant chamber, while expanding refrigerant in the other refrigerant chamber. Compression and expansion of the refrigerant causes phase transitions, thermal energy changes within the engine 10, and thermal energy transfers among the chambers as described herein above 408. Thermal differentials within the engine permit TEGs within the plungers 105, 106, 107, and 108 to generate electrical energy 410. The TEGs continue to produce electrical energy until thermal equilibrium is substantially achieved 412. After a predetermined time period or energy production threshold is achieved by the TEGs, the first rod 109 is released 414. Release of the first rod 109 enables coils or an electric generator to produce electrical energy 416. As described herein above, in one embodiment motion of the first rod 109 may be utilized as mechanical work. Additional thermal changes in the engine 10 may be used by the TEGs to produce electrical energy. After achieving a predetermined electrical energy production level or a predetermined elapsed time period, the engine 10 may be transitioned to a second phase of the energy generation cycle by moving the second rod 110 into an opposite position within the engine 10. In one embodiment, the second rod 110 is moved from the position shown in FIG. 2 to the position of the rod 110 shown in FIG. 3.

In one embodiment of the engine 10, calculations were made for a temperature range of between 292.150000-294.150000 K, a refrigerant pressure between 884.800000-935.700000 kPa, a gas pressure of 2000.000000 kPa, and a gas volume range of 0.026582-0.026764 m3. Under these operating conditions the calculated work into the engine was 0.110252 kJ, the calculated sum of heat released and absorbed was 1.754609 kJ, and the calculated potential work output was 0.727908 kJ.

In another calculated, the engine 10 operated at a temperature range of between 283.150000-303.150000 K, a refrigerant pressure between 680.900000-1192.000000 kPa, a gas pressure of 2000.000000 kPa, and a gas volume range of 0.001853-0.001984 m3. Under these operating conditions the calculated work into the engine was 0.114175 kJ, the calculated sum of heat released and absorbed was 1.348408 kJ, and the calculated potential work output was 0.523868 kJ.

As one skilled in the art will recognize, results indicated that the engine 10 is more efficient at the smaller temperature gradients. This result can be attributed to temperature rises in the refrigerant's compression chamber, latent heat decreases, and saturation pressure increases. Additionally, more generated and absorbed heat of the refrigerant is transferred to and from the expansion and contraction gas, the less the temperature changes.

As one skilled in the art will readily appreciate, the first and second energy generation states may be switched in an embodiment of the disclosure. For example, the first energy generation state may include transitioning the engine 10 to the energy generation state shown in FIG. 3 and described herein above with reference to a second energy generation state.

The disclosure has described certain preferred embodiments and modifications thereto. Further modifications and alterations may occur to others upon reading and understanding the specification. Therefore, it is intended that the disclosure not be limited to the particular embodiment(s) disclosed as the best mode contemplated for carrying out this disclosure, but that the disclosure will include all embodiments falling within the scope of the appended claims.

The invention claimed is:

1. Apparatus for generating energy, the apparatus comprising:
   a first housing structure configured to contain a first rod-plunger assembly, wherein the first rod-plunger assembly is configured and positioned within the first housing structure to create a first and second gaseous chamber;
   a second housing structure configured to contain a second rod-plunger assembly, wherein the second rod-plunger assembly is configured and positioned within the second housing structure to create a first and second refrigerant chamber;
   a first coil wrapped around a first rod of the first rod-plunger assembly;
   a second coil wrapped around a second rod of the second rod-plunger assembly;
   a power source configured to supply electrical current to the first and second coils; and
   an energy storage device configured to store electrical energy generated from movement of the first and second rods and further configured to supply electrical current through at least one of the first and second coils,
   wherein the first gaseous chamber and the first refrigerant chamber are thermally coupled, and
   wherein the second gaseous chamber and the second refrigerant chamber are thermally coupled.

2. The apparatus of claim 1, wherein at least one plunger of the first and second rod-plunger assemblies includes at least one thermoelectric generator configured to generate electrical energy from heat differences within the apparatus.

3. The apparatus of claim 1, wherein the first and second gaseous chambers contain a gaseous mixture.

4. The apparatus of claim 1, wherein the first and second refrigerant chambers contain a refrigerant.

5. The apparatus of claim 4, wherein the refrigerant is a Type 1 refrigerant.

6. The apparatus of claim 5, wherein the Type 1 refrigerant comprises matter selected from the group consisting of carbon dioxide, ammonia, or a fluorocarbon.

7. The apparatus of claim 1, further comprising: an electrical motor mechanically linked to the second rod and configured to provide energy to move the second rod laterally within the second housing structure.

8. The apparatus of claim 7, wherein the electrical motor is additionally configured to generate electrical energy when driven by an external mechanical force, and wherein the electrical motor is mechanically linked to the first rod and further configured to generate electrical energy using physical motion of the first rod within the first housing structure.

9. The apparatus of claim 1, further comprising: a linear actuator mechanically linked to the second rod-plunger assembly and configured to selectively move the second rod within the second housing structure.

10. The apparatus of claim 1, further comprising:
    a first blocking member configured to selectively actuate into the first rod to hold the first rod in a selected position; and
    a second blocking member configured to selectively actuate into the second rod to hold the second rod in a selected position.

11. Apparatus for generating energy, the apparatus comprising:

a first housing structure configured to contain a first rod-plunger assembly, wherein the first rod-plunger assembly is configured and positioned within the first housing structure to create a first and second gaseous chamber;

a second housing structure configured to contain a second rod-plunger assembly, wherein the second rod-plunger assembly is configured and positioned within the second housing structure to create a first and second refrigerant chamber;

a linear actuator mechanically linked to the second rod-plunger assembly and configured to selectively move the second rod within the second housing structure, said actuator being configured to receive power from an external power source;

an electric generator mechanically linked to the first rod-plunger assembly and configured to generate electrical energy using physical motion of the first rod within the first housing structure;

an energy storage device configured to store electrical energy generated by the electrical generator, wherein the first gaseous chamber and the first refrigerant chamber are thermally coupled, and wherein the second gaseous chamber and the second refrigerant chamber are thermally coupled.

12. The apparatus of claim 11, wherein the electric generator is a three-phase DC motor configured to generate electrical energy.

13. The apparatus of claim 11, wherein at least one plunger of the first and second rod-plunger assemblies includes at least one thermoelectric generator configured to generate electrical energy from heat differences within the apparatus.

* * * * *